United States Patent [19]
Pierrat

[11] Patent Number: 6,096,457
[45] Date of Patent: Aug. 1, 2000

[54] METHOD FOR OPTIMIZING PRINTING OF A PHASE SHIFT MASK HAVING A PHASE SHIFT ERROR

[75] Inventor: Christophe Pierrat, Boise, Id.

[73] Assignee: Micron Technology, Inc., Boise, Id.

[21] Appl. No.: 09/031,639

[22] Filed: Feb. 27, 1998

[51] Int. Cl.[7] ............................................. G03F 9/00
[52] U.S. Cl. ......................................................... 430/5
[58] Field of Search .............................. 430/5, 22, 322

[56] References Cited

U.S. PATENT DOCUMENTS

| | | | |
|---|---|---|---|
| H1525 | 4/1996 | Geil et al. ........................... 355/44 |
| 4,608,268 | 8/1986 | Shimkunas ............................ 427/8 |
| 4,653,860 | 3/1987 | Hendrix .............................. 350/336 |
| 4,686,162 | 8/1987 | Stangl et al. ......................... 430/5 |
| 5,045,419 | 9/1991 | Okumura ............................. 430/20 |
| 5,047,117 | 9/1991 | Roberts .............................. 156/643 |
| 5,194,345 | 3/1993 | Rolfson . |
| 5,194,346 | 3/1993 | Rolfson et al. ....................... 430/5 |
| 5,208,125 | 5/1993 | Lowrey et al. . |
| 5,217,830 | 6/1993 | Lowrey .............................. 430/5 |
| 5,225,035 | 7/1993 | Rolfson ............................. 156/643 |
| 5,229,872 | 7/1993 | Mumola ............................. 359/40 |
| 5,240,796 | 8/1993 | Lee et al. . |
| 5,254,218 | 10/1993 | Roberts et al. . |
| 5,281,500 | 1/1994 | Cathey et al. ......................... 430/5 |
| 5,288,568 | 2/1994 | Cathey, Jr. ........................... 430/5 |
| 5,288,569 | 2/1994 | Lin .................................. 430/5 |
| 5,372,901 | 12/1994 | Rolfson et al. . |
| 5,468,578 | 11/1995 | Rolfson .............................. 430/5 |
| 5,487,963 | 1/1996 | Sugawara ............................ 430/5 |
| 5,495,959 | 3/1996 | Rolfson . |
| 5,503,951 | 4/1996 | Flanders et al. ....................... 430/5 |
| 5,527,645 | 6/1996 | Pati et al. ............................ 430/5 |
| 5,536,606 | 7/1996 | Doan ................................. 430/5 |
| 5,546,225 | 8/1996 | Shiraishi ............................ 359/559 |
| 5,565,286 | 10/1996 | Lin .................................. 430/5 |
| 5,567,573 | 10/1996 | Morton ............................ 430/320 |
| 5,576,126 | 11/1996 | Rolfson . |
| 5,582,939 | 12/1996 | Pierrat .............................. 430/5 |
| 5,667,918 | 9/1997 | Brainerd et al. . |
| 5,672,450 | 9/1997 | Rolfson . |
| 5,686,208 | 11/1997 | Le et al. ............................. 430/5 |
| 5,691,541 | 11/1997 | Ceglio et al. ....................... 250/492 |
| 5,695,896 | 12/1997 | Pierrat . |
| 5,698,347 | 12/1997 | Bae .................................. 430/5 |
| 5,718,829 | 2/1998 | Pierrat .............................. 430/5 |
| 5,759,724 | 6/1998 | Rolfson . |
| 5,766,829 | 6/1998 | Cathey et al. . |
| 5,786,116 | 7/1998 | Rolfson . |
| 5,827,625 | 10/1998 | Lucas et al. ......................... 430/5 |

OTHER PUBLICATIONS

Ahn, C., et al., "Study of optical proximity effects using off–axis illumination with attenuated phase shift mask", *Proceedings of SPIE, vol. 2440*, Society of Photo–Optical Instrumentation Engineers, Bellingham, WA, 222–39, (1995).

Barouch, E., et al., "Vector aerial image with off–axis illumination", *Proceedings of SPIE, vol. 1927, Pt. 2*, Optical/Laser Microlithography Conference, San Jose, CA, 686–708, (1993).

Bor, Z., et al., "New phase–shifting technique for deep UV excimer laser–based lithography", *Proceedings of SPIE, vol. 2380*, Society of Photo–Optical Instrumentation Engineers, Bellingham, WA, 195–202, (1995).

(List continued on next page.)

*Primary Examiner*—S. Rosasco
*Attorney, Agent, or Firm*—Schwegman, Lundberg, Woessner & Kluth P.A.

[57] ABSTRACT

Optimizing printing of an image from an alternating phase shifting mask having a phase shift error is accomplished using off-axis illumination. By simulating the image using varying off-axis illumination parameters, optimized parameters are selected to compensate for the phase shift error. Once the off-axis illumination parameters are optimized, the image is shot. In addition, the method of varying off-axis illumination parameters to compensate for a phase shift error permits an alternating phase shifting mask to be shot at two different wavelengths.

58 Claims, 8 Drawing Sheets

OTHER PUBLICATIONS

Brunner, T.A., "Rim phase shift mask combined with off–axis illumination: a path to 0.5 lambda/numerical aperture geometries", *Optical Engineering, vol. 32, No. 10*, 2337–43, (Oct. 1993).

Erdelyi, M., et al., "Enhanced microlithography using combined phase shifting and off–axis illumination", *Japanese Journal of Applied Physics, Part 2: vol. 34, No. 12A*, L1629–L1631, (Dec. 1, 1995).

Erdelyi, M., et al., "New interferometric phase–shifting technique for sub–half–micron laser microlithography", *Proceedings of SPIE, vol. 2440*, Society of Photo–Optical Instrumentation Engineers, Bellingham, WA, 827–37, (1995).

Ham, Y., et al., "Fundamental analysis of fabrication of 256 MB DRAM using the phase shift technology", *Proceedings of SPIE, vol. 2197*, Optical/Laser Microlithography VII Conference, San Jose, CA, 243–52, (1994).

Kim, K., et al., "Implementation of i–line lithography to 0.30 um design rules", *Proceedings of SPIE, vol. 2440*, Society of Photo–Optical Instrumentation Engineers, Bellingham, WA, 76–87, (1995).

Levenson, M.D., "Extending optical lithography to the gigabit era", *Microlithography World, vol. 3, No. 4*, (Autumn 1994).

Lin, B.J., "The Attenuated Phase–Shifting Mask", *Solid State Technology, 35*, 43–47, (Jan. 1992).

Loong, W., et al., "Simulation study of a new phase–shifting mask: halftone–rim", *Proceedings of SPIE, vol. 2440*, Society of Photo–Optical Instrumentation Engineers, Bellingham, WA, 448–57, (1995).

Ogawa, T., et al., "Subquarter micron optical lithography with practical superresolution technique", *Proceedings of SPIE, vol. 2440*, Society of Photo–Optical Instrumentation Engineers, Bellingham, WA, 772–83, (1995).

Thakar, G.V., et al., "High performance 0.3 mu m CMOS I–line lithography and BARC", *Digest of Technical Papers, 1995 IEEE Symposium on VLSI Technology*, Piscataway, NJ, 75–76, (1995).

Yan, P., et al., "Sub–micron low–k//1 imaging characteristics using a DUV printing tool and binary masks", *Proceedings of SPIE, vol. 2440*, Society of Photo–Optical Instrumentation Engineers, Bellingham, WA, 270–o77, (1995).

210 215 210 220 210 215 210 220 210

205

NA=0.54
SIGMA=0.35
DEFOCUS=0.5 μM
PHASE=90°

NA=0.54
SIGMA=0.4-0.62
DEFOCUS=0 μM
PHASE=90°

NA=0.54
SIGMA=0.4-0.62
DEFOCUS=0.5 μM
PHASE=90°

NA=0.54
SIGMA=0.4-0.62
DEFOCUS=1 μM
PHASE=90°

METHOD FOR OPTIMIZING PRINTING OF A PHASE SHIFT MASK HAVING A PHASE SHIFT ERROR

FIELD OF THE INVENTION

This invention relates generally to photolithography and in particular to a method for optimizing printing of an alternating phase shift mask having a phase shift error.

BACKGROUND OF THE INVENTION

Semiconductors are now produced having several million transistors per die. To fit all of these devices on a single die, feature sizes must be minute. For example, a width of interconnect lines and a spacing between such lines needs to be very small. Accordingly, advances in semiconductor manufacturing allowing for more dense devices have resulted in the need for accurate, high resolution photolithography.

In general, photolithography involves transferring a mask pattern from a mask reticle onto a photoresist-coated substrate. The transfer is done using an imaging lens system and a beam of light. The reticle is often made from a slice of transparent quartz. The mask pattern on the reticle is a design that can be made up of opaque chromium regions and transparent quartz regions. If the beam of light is composed of coherent light rays, the mask pattern would be transferred exactly to the coated substrate.

However, light rays are not coherent and diffraction causes light to bend as it passes through the pattern reticle. Diffraction becomes significantly problematic when the chromium and transparent regions on the mask reticle are near in size to the wavelength of a beam of light. When diffraction occurs, regions on the coated substrate which should be dark receive the diffracted light. Thus, the pattern is adversely affected by diffracted light.

Phase shifting lithography is a method of reducing the effects of light diffraction. Adjacent transparent quartz regions of a pattern on an alternating phase shifting mask, which are separated by an opaque region, are created such that the phase of the light going through one of the transparent regions is shifted, or delayed, 180 degrees from that of light going through an adjacent transparent region. Shifting light by 180 degrees mitigates the problem caused by the diffraction.

When light is diffracted from two adjacent transparent regions onto a dark region of the substrate, the diffracted light cancels each other out. The cancellation occurs due to the additive nature of light rays: two rays having a phase difference of 180 degrees result in no light. Thus, shifting the phase of the light helps to ensure that the dark region remains dark.

One way to accomplish phase shifting is to etch every other transparent region on the quartz mask reticle so that light traveling through the etched regions will exit the reticle one-half wavelength behind light traveling through the unetched regions. However, it is difficult to etch the quartz reticle so that light has a phase shift of exactly 180 degrees. When a phase of light is not fully shifted 180 degrees, the alternating phase shifting mask has a phase error and diffraction remains a problem. Generally, when an alternating phase shifting mask has a phase shift error, the mask is discarded.

For the reasons stated above, and for other reasons stated below which will become apparent to those skilled in the art upon reading and understanding the present specification, there is a need in the art to mitigate the problems of a phase shift error present in an alternating phase shifting mask.

SUMMARY OF THE INVENTION

The above mentioned problems associated with diffraction caused by an alternating phase shifting mask having a phase shift error are addressed by the present invention which will be understood by reading and studying the following specification.

An image from an alternating phase shifting mask having a phase shift error is printed using off-axis illumination. Shooting the mask off-axis compensates for the phase shift error. In operation, an illuminator providing a light source simulates the image for determining off-axis illumination parameters that will optimize printing of the image at best focus. Once the parameters establishing best focus are optimized, the image is shot. Because the phase error is compensated for by off-axis illumination, the alternating phase shifting mask may be utilized instead of having to discard it. In addition, the method of varying off-axis illumination parameters to compensate for a phase shift error permits an alternating phase shifting mask to be shot at two different wavelengths. An alternating phase shifting mask initially configured for operation at a first wavelength using on-axis illumination may be shot at a lower second wavelength because the phase shift error associated with the second wavelength is compensated by shooting the mask off-axis.

In one embodiment, a photolithography system comprises an alternating phase shifting mask having a phase shift error, and an illuminator configured for off-axis illumination wherein the illuminator performs image simulations using the alternating phase shifting mask for defining off-axis illumination parameters to compensate for the phase error.

In another illustrative embodiment, a photolithography system comprises an alternating phase shifting mask having a phase shift error, an illuminator providing a light source, and a means for controlling the light source to optimize printing of the alternating phase shifting mask. The means for controlling the light source utilizes off-axis illumination.

In yet another embodiment, a method to optimize printing of an alternating phase shifting mask having a phase error comprises the steps of configuring an illuminator for off-axis illumination, performing simulations of an image on the alternating phase shifting mask, and adjusting off-axis illumination parameters based upon the simulations.

In a still further embodiment, a method to optimize printing of an alternating phase shifting mask having a phase error comprises the steps of providing an alternating phase shifting mask having a phase shift error, providing an illuminator having a light source, performing simulations on an image of the alternating phase shifting mask, and providing a means for controlling the light source to optimize printing of the alternating phase shifting mask based upon the simulations. The step of providing an illuminator utilizes off-axis illumination.

In another embodiment, a method of printing an image from an alternating phase shifting mask using two different wavelengths comprises the steps of providing an alternating phase shifting mask, providing a first illuminator having a light source at a first wavelength, printing an image on the alternating phase shifting mask, providing a second illuminator having a light source at a second wavelength, configuring the second illuminator for off-axis illumination, performing simulations of the image on the alternating phase shifting mask, adjusting off-axis illumination parameters based upon the simulations, and printing an image on the alternating phase shifting mask.

In yet another embodiment, a method of printing an image from an alternating phase shifting mask using an illuminator operating at a shorter wavelength from what the mask was initially designed for comprises the steps of providing an alternating phase shifting mask, providing an illuminator having a light source, configuring the illuminator for off-axis illumination, performing simulations of the image on the alternating phase shifting mask, adjusting off-axis illumination parameters based upon the simulations, and printing an image on the alternating phase shifting mask.

Optimizing printing of an image from an alternating phase shifting mask having a phase shift error is accomplished using off-axis illumination. By first simulating the image, parameters with respect to off-axis illumination are optimized to compensate for the phase shift error. In different embodiments of the invention, optical characteristics of the mask supporting transparency, opaqueness, partial opaqueness, and phase shifting effects of varying scope and combinations are described. Still other and further embodiments, aspects and advantages of the invention will become apparent by reference to the drawings and by reading the following detailed description.

DETAILED DESCRIPTION OF THE INVENTION

Figure 1A:
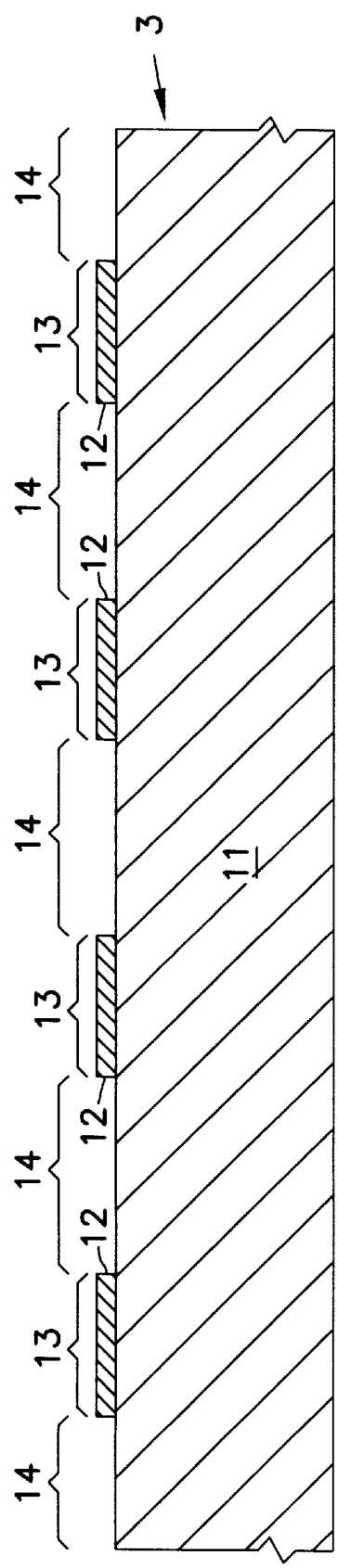
FIG. 1A illustrates a cross sectional view of a conventional mask.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The present invention is a method of printing an image from an alternating phase shifting mask having a phase shift error using off-axis illumination. The image is first simulated using off-axis illumination at various parameters to determine best focus of the image. Once the off-axis illumination parameters are optimized, the image is shot onto a substrate. Focusing of the image is thus accomplished using off-axis illumination from empirical data provided by the simulations run on the mask. In addition, the method of varying off-axis illumination parameters to compensate for a phase shift error permits an alternating phase shifting mask to be shot at two different wavelengths.

Figure 1B:
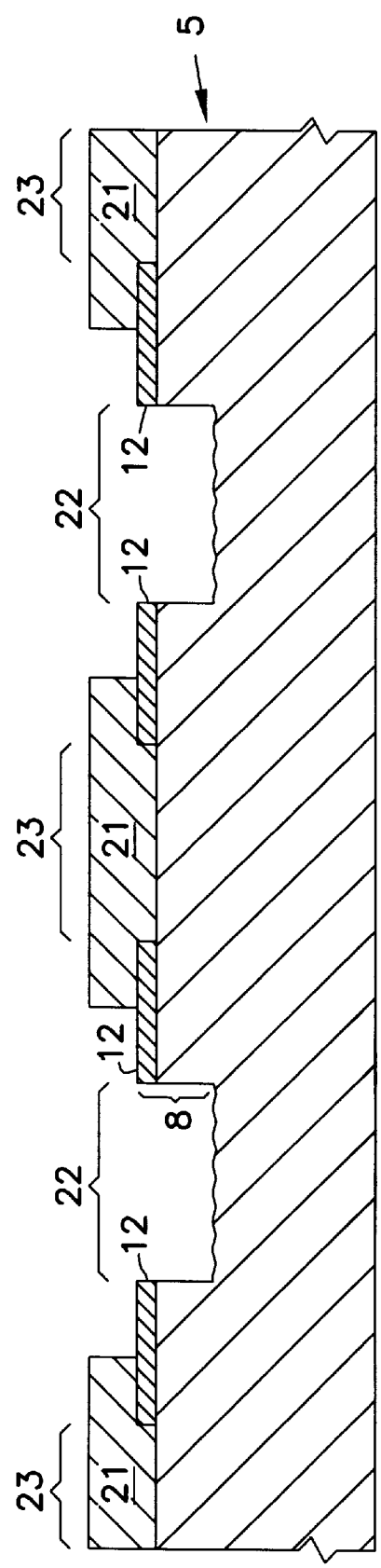
FIG. 1B illustrates a cross sectional view of an alternating phase shifting mask.

In reference to FIGS. 1A–B, a conventional mask and an alternating phase shifting masked are illustrated, respectively. A portion of a conventional photolithographic mask 3 is depicted in cross-sectional format in FIG. 1A. The mask 3 consists of a uniformly thick quartz plate 11 and a thin, chromium metal layer 12 which has been selectively etched so as to create a pattern of opaque regions 13 and transparent regions 14.

The conventional mask 3 is converted to an alternating phase shifting mask 5, as illustrated in FIG. 1B, by masking every other transparent region 14 with photoresist 21, and then subjecting the alternating phase shifting mask 5 to a plasma etch. This etching is performed until the unmasked transparent regions 22 are relieved to a depth such that rays of light from a coherent source pass through the unetched transparent regions 23 a predetermined wavelength behind rays of light from the same coherent source passing through neighboring etched transparent regions 22. Varying the depth 8 of the etched regions 22 determines the amount of phase shift. The mathematics employed in the construction of an alternating phase shifting mask are well known in the art and will not be discussed herein.

When light passes through the etched regions 22 in an alternating phase shifting mask, a 180 degree shift in phase is achieved with respect to a phase of light passing through the unetched transparent regions 23. Although such a process works acceptably in principle, the plasma etch damages the optical characteristics of the quartz so that transmittance through the etched transparent regions 22 is reduced as compared to the transmittance through unetched transparent regions 23. A resulting error in a phase shift has a somewhat less than adequate cancellation effect on neighboring diffraction patterns on a surface exposed by the alternating phase shifting mask 5.

Figure 2:
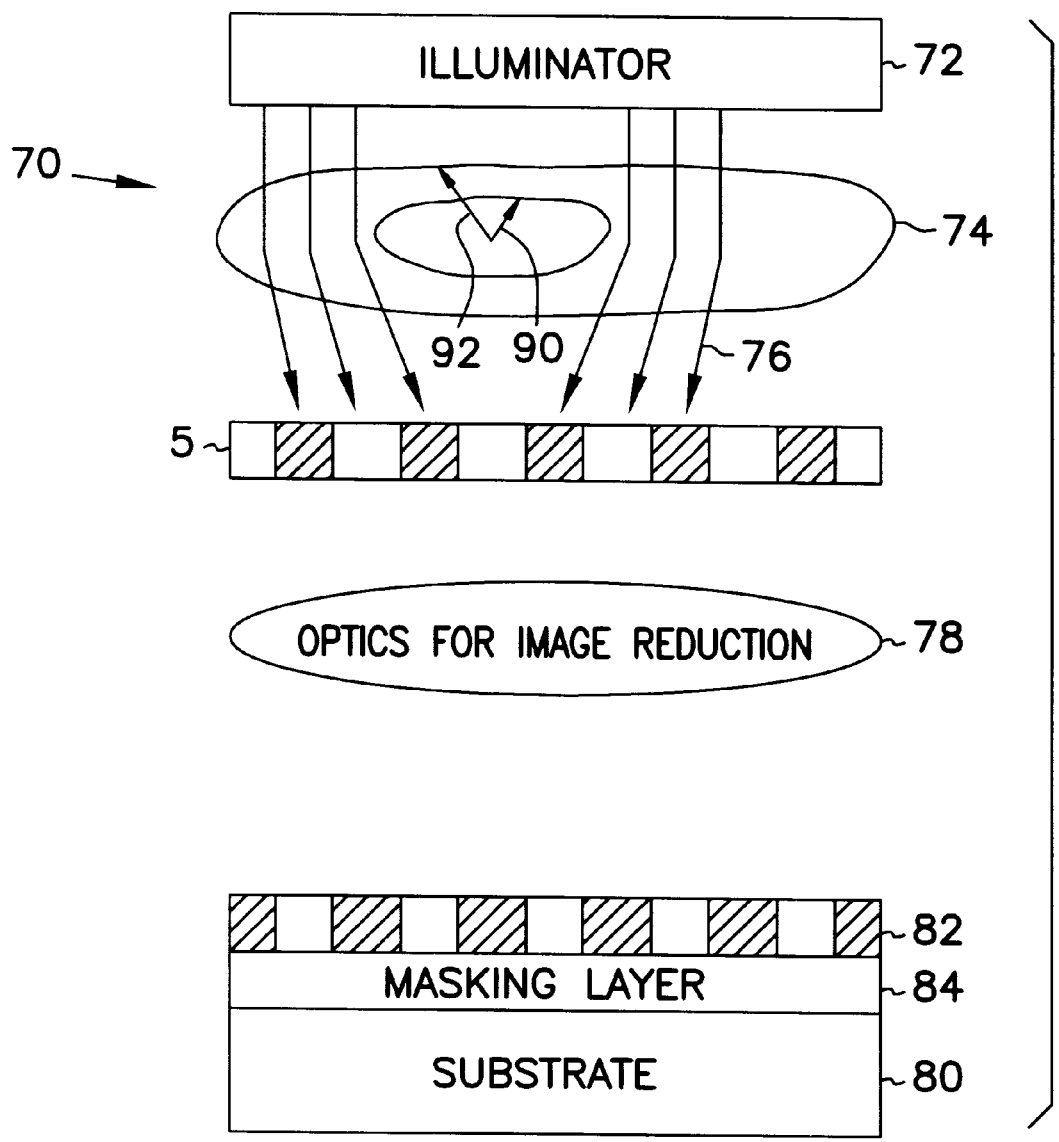
FIG. 2 illustrates a photolithographic system incorporating an off-axis illuminator with an alternating phase shifting mask.

FIG. 2 illustrates a photolithographic system 70 incorporating an illuminator 72 with an alternating phase shifting mask 5. The photolithographic system 70, such as a stepper, consists of the alternating phase shifting mask 5 illustrated in FIG. 1B inserted in a light path of the illuminator 72 to control a wafer image resulting on a substrate 80 structure. Off-axis illumination is achieved by the illuminator 72 having a restrictor means 74 for controlling the light 76 provided by the illuminator 72. The illuminator 72 is a source for incoming light 76, such as ultra violet (UV) light. The light 76 is directed through the restrictor means 74, the alternating phase shifting mask 5, and an optics lens 78 before falling onto a photoresist layer 82 overlying a conductive layer 84 which overlies the substrate structure 80.

By shining the light 76 through the alternating phase shifting mask 5, a light pattern is cast upon the semiconductor wafer 84 or a portion thereof which is covered with the photoresist 82 or a similar material. The portion of this photoresist material 82 which is under the mask and subject to the light 76 is accordingly hardened due to the exposure it receives. If a negative photoresist material 82 is used, a portion of the photoresist material 82 not exposed to the light 76 is removed to expose portions of the substrate structure 80 while the remaining photoresist 82 protects unexposed portions of the substrate during subsequent processing steps. Subsequently, a suitable well-known solvent material etches away the unhardened portion of the photoresist 82 to form an integrated circuit.

The restrictor means 74 is generally an adjustment on the illuminator 72 wherein the light 76 provided by the illuminator 72 is varied with respect to an optical axis of the illumination system 70. By controlling a source of the light 76 via the restrictor means 74 before reaching the alternating phase shifting mask 5, off-axis illumination is achieved. Utilization of off-axis illumination improves process latitude and improves a depth of focus of an image on the alternating phase shifting mask 5 as compared to conventional illumination techniques when the alternating phase shifting mask 5 has a phase shift error.

There are a various methods to achieve off-axis illumination. The restrictor means 74 referenced in FIG. 2 is a general reference applicable to a variety of methods that may be utilized for achieving off-axis illumination. Methods of achieving off-axis illumination are well known to one skilled in the art.

By way of illustration of the present invention, the restrictor means 74 illustrated in FIG. 2 is a ring having an inner radius 90 and an outer radius 92 wherein light 76 is not passed within the inner radius 90. Light 76 is passed only between the area inside of the outer radius 92 and outside the inner radius 90. The inner radius 90 is referred to as sigma in. The outer radius 92 is referred to as sigma out. By varying the sigma in 90 and the sigma out 92 parameters, depth of focus (DOF) of an image on the alternating phase shifting mask 5 may be varied. If the alternating phase shifting mask 5 has a phase shifting error, then the sigma in and sigma out parameters are selected to compensate for the phase shift error. Another parameter effecting image is defocus. To select the proper defocus value, a mask is shot at different defocus values for determining which one provides the best image.

An image on the alternating phase shifting mask 5 is simulated using off-axis illumination at various parameters (e.g., sigma in, sigma out and defocus) to determine best focus of the image. Empirical data provided by the one or more simulations permits the photolithographic system 70 to optimize the off-axis illumination parameters.

Figure 3:
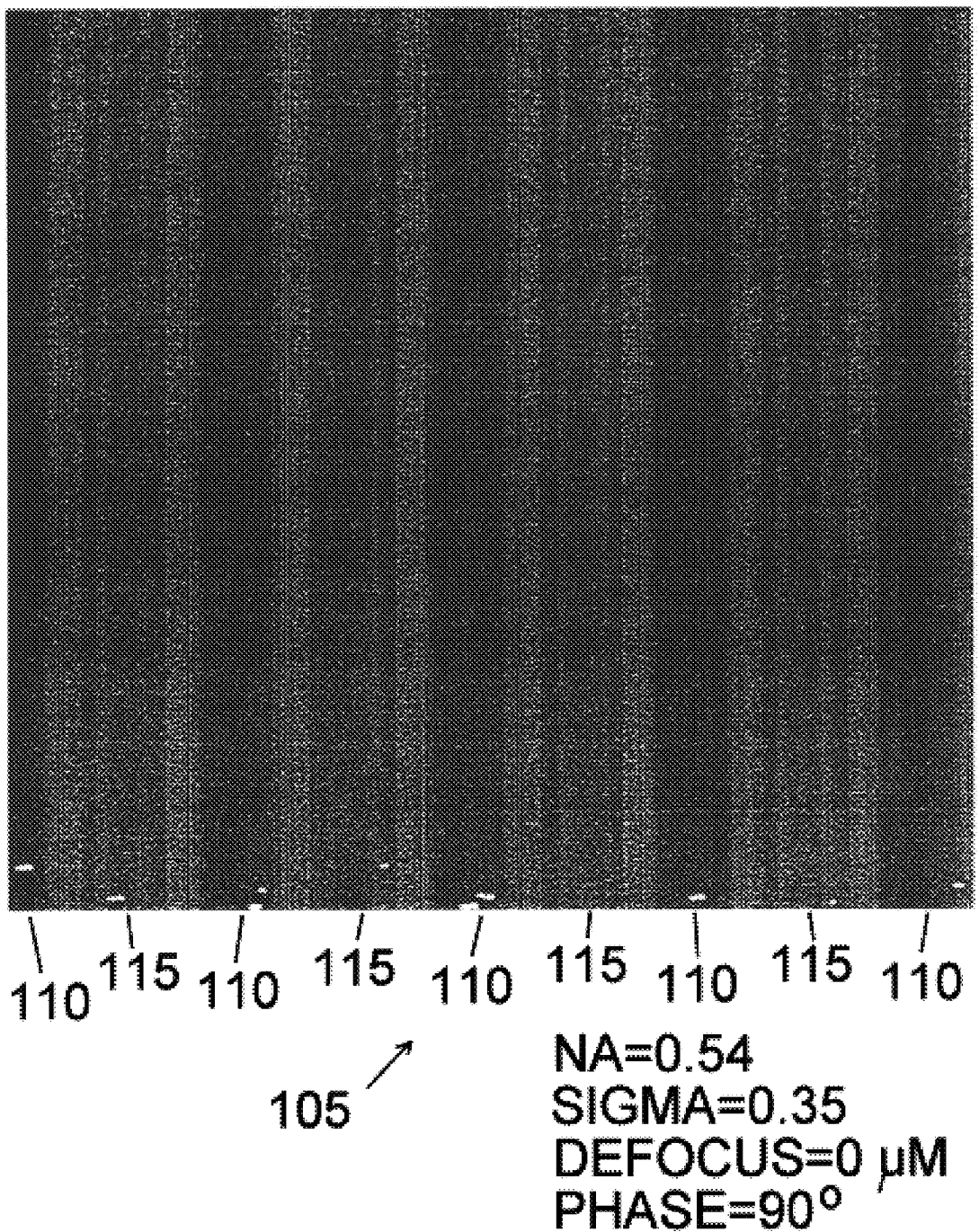
FIGS. 3–5 are aerial simulations at varying defocus parameters using on-axis illumination with an alternating phase shifting mask having a phase shift error.
Figure 4:
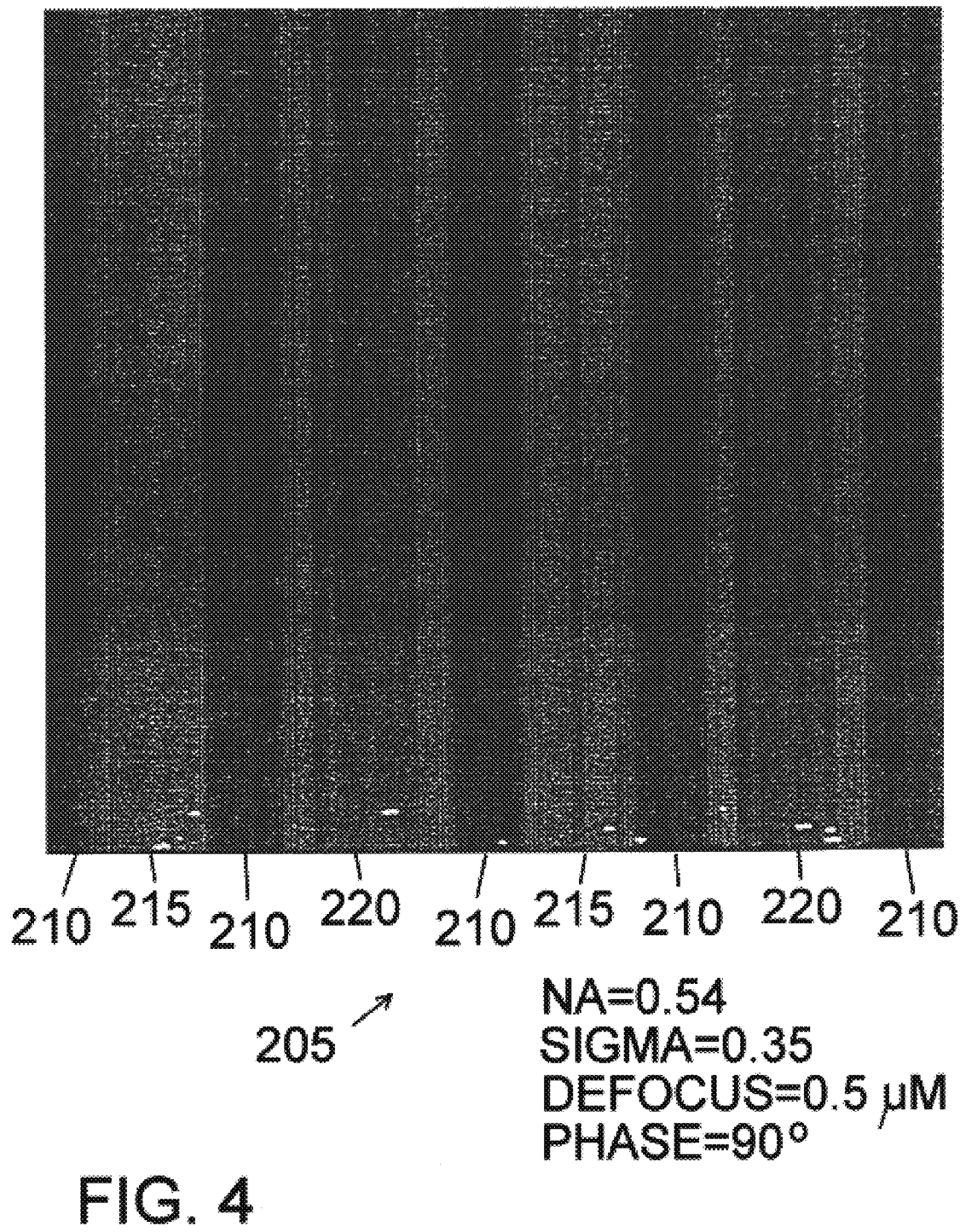
Figure 5:
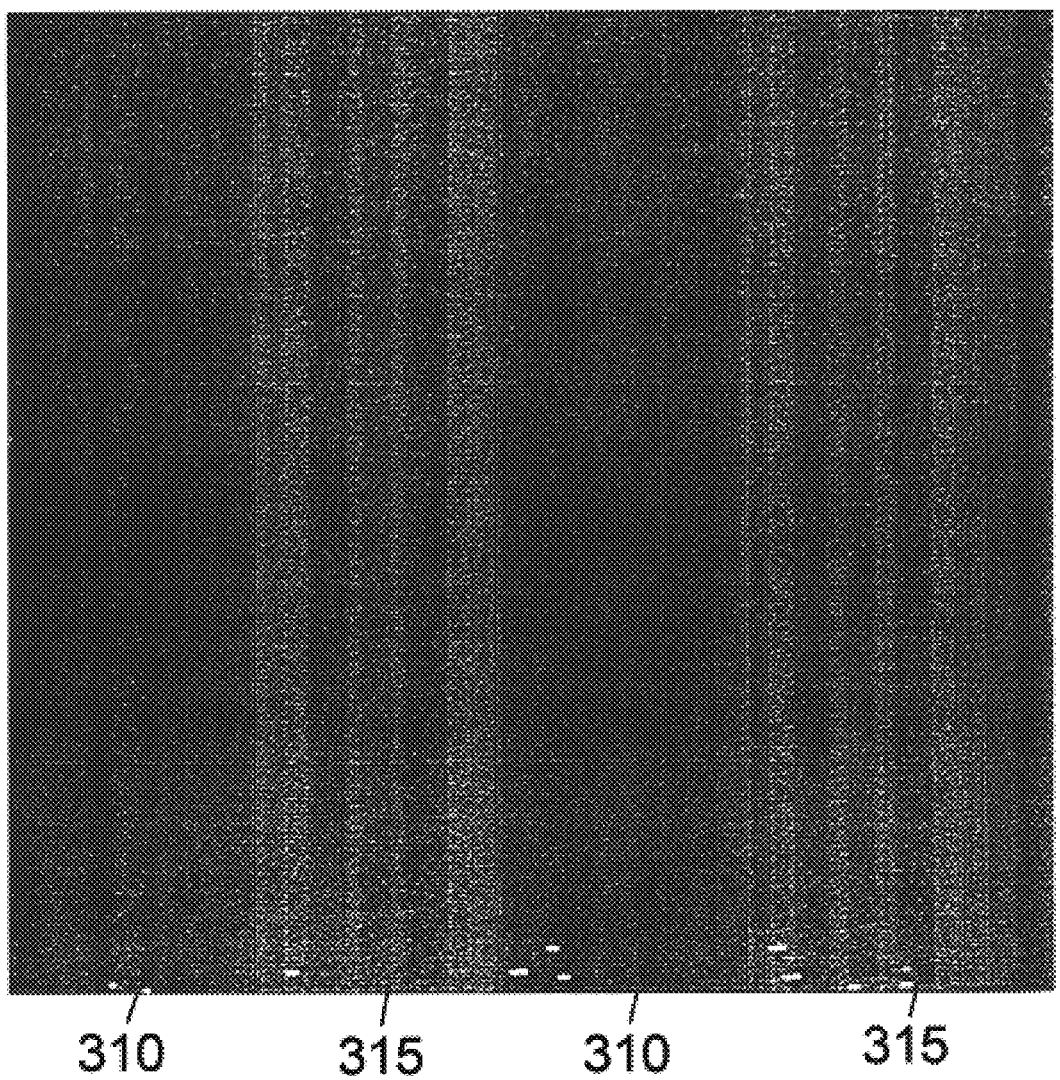
Figure 6:
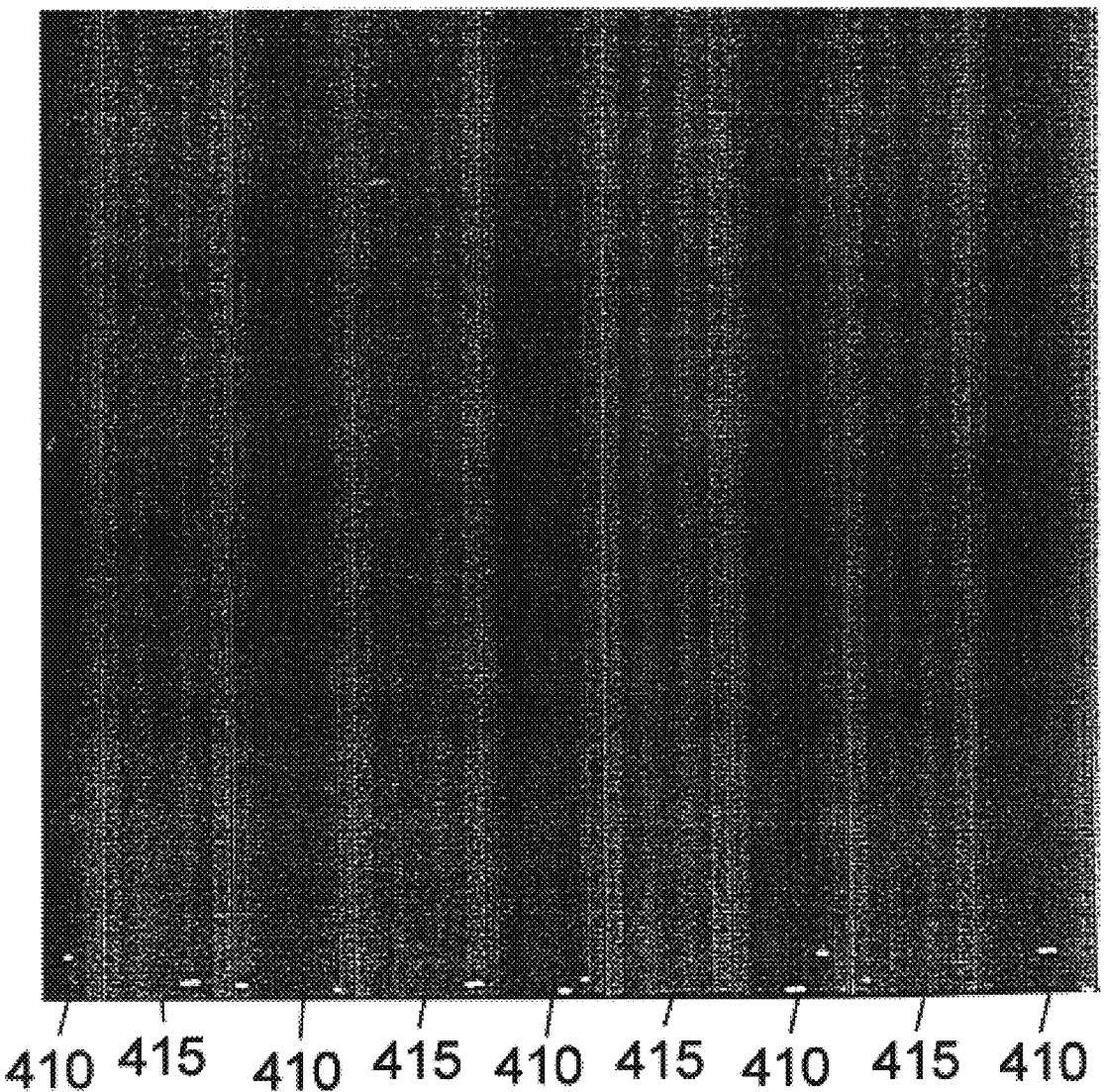
FIGS. 6–8 are aerial simulations at varying defocus parameters using off-axis illumination with an alternating phase shifting mask having a phase shift error.
Figure 7:
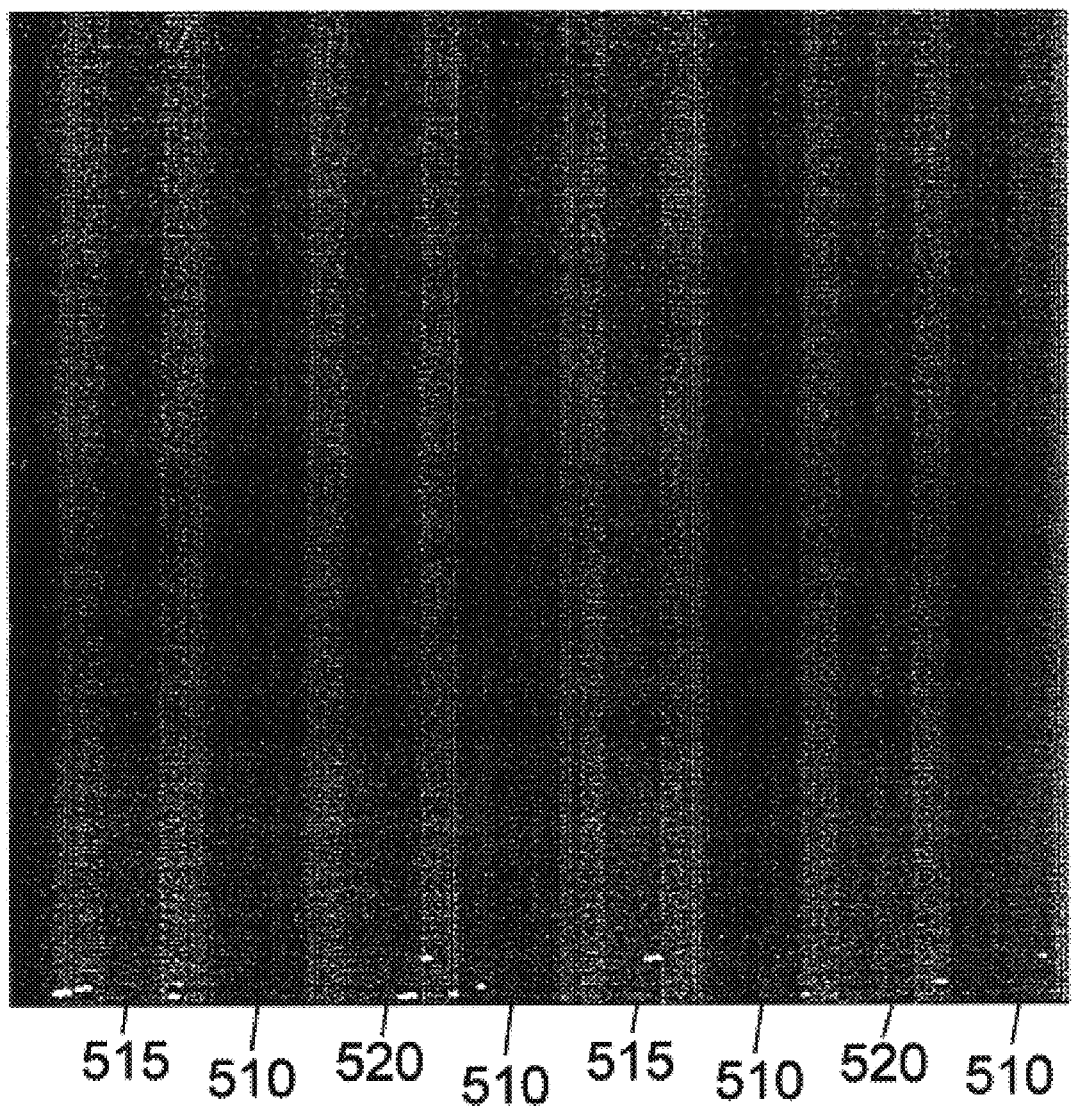
Figure 8:
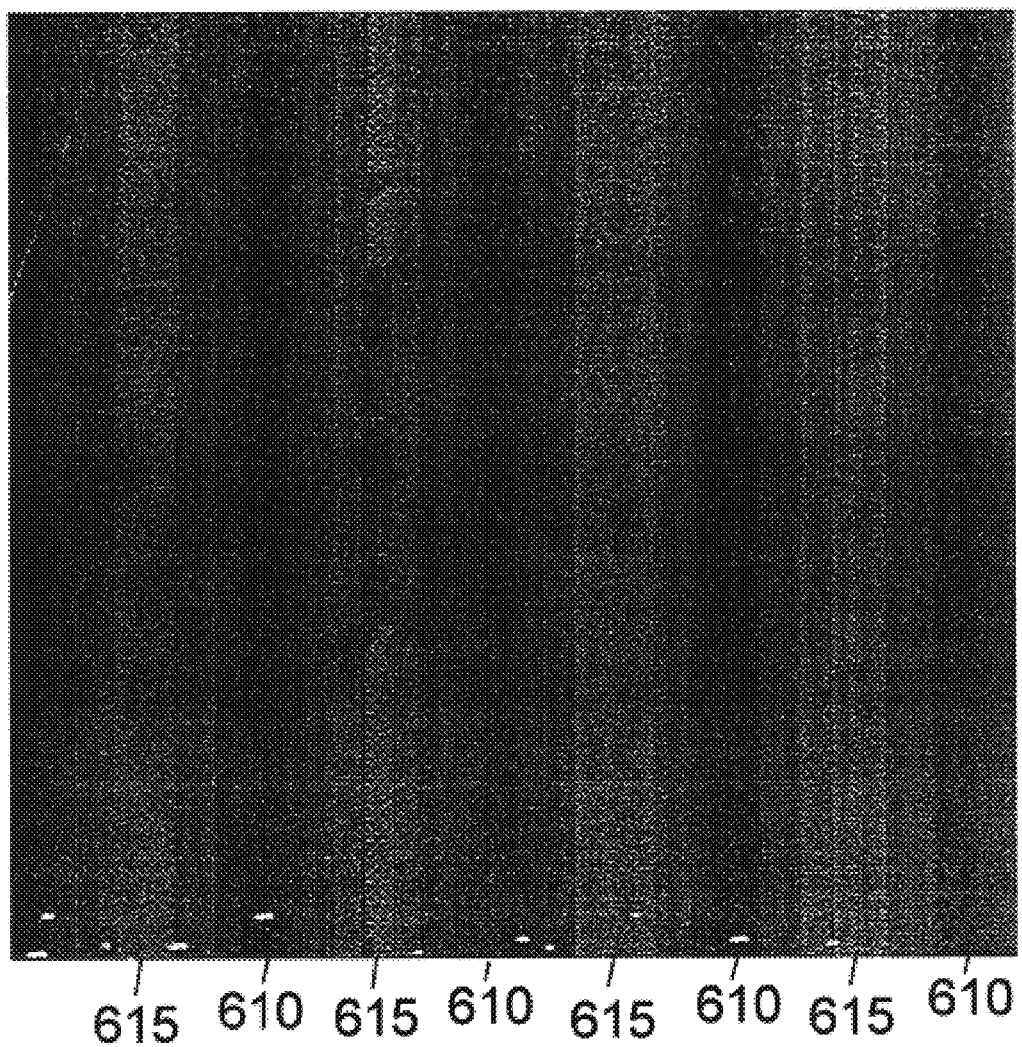

Effects of an alternating phase shifting mask 5 having a phase shift error is illustrated in FIGS. 3–5 using on-axis illumination and in FIGS. 6–8 using off-axis illumination. Instead of the alternating phase shifting mask 5 having a desired phase shift of 180 degrees, the alternating phase shifting mask 5 has a phase shift of 90 degrees. A 90 degree phase error is a worst case scenario for purposes of illustrating compensation provided by shooting the alternating phase shifting mask 5 using off-axis illumination. While a 90 degrees phase shift error is an extreme example, an alternating phase shifting mask 5 having a phase shift error less than 90 degrees is also compensated by using off-axis illumination.

FIGS. 3–5 are aerial simulations at varying defocus parameters using on-axis illumination with the alternating phase shifting mask 5 having a phase shift error of 90 degrees. A numerical aperture (NA) remains a constant 0.54 for each of the three figures. Sigma also remains a constant 0.35. Since on-axis illumination is utilized, the restrictor means 74 illustrated in FIG. 2 is more like a disk. Sigma represents the radius of this disk.

The aerial images are simulated line-in-space wafer image patterns as if a mask pattern contains equidistant chrome lines separated by transparent regions. At best focus, dark lines should be identical in size and spacing. Referring to FIG. 3, a simulated image 105 is shown with a defocus of 0 µm. Defocus and best focus are interchangeable terms.

Dark lines 110 represent low levels of intensity and gray areas 115 represent high intensity levels. When printed on a wafer, the dark lines 110 represent lines and the gray areas 115 represent spaces. Because simulation 105 is performed at best focus, the dark lines 110 are nearly equidistant from one another. However, the dark lines 110 gradually fade due to the diffraction caused by the 90 degree phase error.

A simulated image 205 in FIG. 4 illustrates the worsening effects of increasing the defocus value from 0 µm to 0.5 µm. The simulated image 205 does not reflect equal line widths and equal spacings between the lines, as reflected in FIG. 3. Because of the 90 degree phase shift error, the image gets more distorted as it gets out of focus. The dark lines 210 remain constant but the spaces alternate in size between narrow spaces 210 and wide spaces 220.

As the defocus value is further increased to 1.0 µm, as illustrated in FIG. 5, two of the spaces disappear and the remaining two spaces 315 are wider. With the larger defocus value, the lines 310 have carried over to the point of covering a space. Every other space has thus disappeared because of a combination of the defocus value and the 90 degree phase shift error.

If there is no phase error, the lines 310 and spaces stay at exactly the same location. When an image is moved out of focus at a zero phase shift error, the lines do not move but the image gets blurry from a change in contrast. Therefore, as illustrated in FIGS. 3–5, a combination of selected defocus values and a 90 degree phase shift error creates a problem for the alternating phase shifting mask 5 using conventional illumination techniques.

FIGS. 6–8 are aerial simulations of the same mask layout as in FIGS. 3–5 except using off-axis illumination. Instead of having a constant sigma of 0.35, the restrictor means 74 has a sigma in radius 90 of 0.4 µm and a sigma out radius 92 of 0.62 µm wherein light 76 is not passed within the inner radius 90. Light 76 is passed only between the area inside of the outer radius 92 and outside the inner radius 90. By varying the sigma in 90 and the sigma out 92 parameters, a depth of focus (DOF) of the image on the alternating phase shifting mask 5 is varied.

To be consistent with FIGS. 3–5, the defocus is increased from 0 µm in FIG. 6, to 0.5 µm in FIG. 7, and to 1.0 µm in FIG. 8. The phase shift error for these three figures remains at 90 degrees and the numerical aperture (NA) remains at 0.54. The sigma in 90 and sigma out 92 values used in FIGS. 6–8 serve as an illustration of the present invention and such values vary depending on a given phase shift error.

The aerial images presented in FIG. 6–8 are simulated line-and-space wafer image patterns as if a mask pattern contains equidistant chrome lines separated by transparent regions. At best focus, dark lines should be identical in size and spacing. Referring to FIG. 6, a simulated image 405 is shown with a defocus of 0 μm. As previously stated, defocus and best focus are interchangeable terms.

Dark lines 410 represent low levels of intensity and gray areas 415 represent high intensity levels. When printed on a wafer, the dark lines 410 represent lines and the gray areas 415 represent spaces. Light areas 415 are considerably more uniform than their counterpart light areas 115 as illustrated in FIGS. 3. This is a result of off-axis illumination which improves process latitude and improves the depth of focus of the image on the alternating phase shifting mask 5 as compared to conventional illumination techniques.

A simulated image 505 in FIG. 7 illustrates the effects of increasing the defocus value from 0 μm to 0.5 μm. The simulated image 505 does not reflect equal line widths and equal spacings between the lines, but light areas 515, 520 are considerably more uniform than their counterpart light areas 215, 220 of FIG. 3 due to the off-axis illumination.

As the defocus value is further increased to 1.0 μm, as illustrated in FIG. 8, spaces 615 are considerably more uniform than the counterpart spaces 315 in FIG. 5. Using off-axis illumination with the larger defocus value, the lines 610 have not carried over to the point of covering a space, as was the result with on-axis illumination.

The simulated images 405, 505, and 605 of FIGS. 6–8 thus use off-axis photolithography in combination with the same alternating phase shifting mask 5 used in FIGS. 3–5 to improve process latitude and improve the depth of focus of the image on the alternating phase shifting mask 5 as compared to conventional illumination techniques. Light areas 415, 515/520, and 615 (representing spaces) corresponding to FIGS. 6–8, respectively, are considerably more uniform than their counterpart light areas 115, 215/220, and 315 as illustrated in FIGS. 3–5, respectively. Although FIG. 8 has a high defocus value of 1 μm, simulation image 605 is only slightly degraded. Thus, the distortion caused by a defocus value and a phase shift error has been greatly mitigated. The use of off-axis photolithography in combination with alternating phase shifting masks improves the results from traditional phase shift systems when the alternating phase shifting mask 5 has a phase error.

The simulated images illustrated in FIGS. 3–8 result from a phase shift error of 90 degrees, which is a worst case scenario. Typically, a phase error will be considerable smaller. For example, the alternating phase shifting mask 5 may have a phase error of 10 degrees. Rather than having a sigma in 90 and a sigma out 92 of 0.4–0.62 μm, a smaller sigma in 90 and sigma out 92 may be used, such as 0.05–0.35 μm. Hence, the results from using off-axis photolithography with an alternating phase shifting mask would readily support a smaller level of image degradation.

Other embodiments of the invention include using the alternating phase shifting mask 5 at two different wavelengths. For example, an alternating phase shifting mask 5 is built with a 180 degree phase shift for an I-line light source operating at 360 mn. The alternating phase shifting mask 5 is shot using on-axis photolithography. Subsequently, the same alternating phase shifting mask 5 is shot using off-axis from an ultra-violet (UV) light source operating at 465 nm. The use of the later illuminator is possible because off-axis illumination compensates for the phase shift error at the lower frequency light source. Thus, the same alternating phase shifting mask 5 is used for two different wavelengths.

Although an alternating phase shifting mask was used throughout the description, the same optimization using off-axis illumination is also applies to attenuating phase shifting masks. Combining the method of the present invention would improve the fidelity of the resultant image.

Although specific embodiments have been illustrated and described herein, it will be appreciated by those of ordinary skill in the art that any arrangement which is calculated to achieve the same purpose may be substituted for the specific embodiment shown. This application is intended to cover any adaptions or variations of the present invention.

CONCLUSION

Optimizing printing of an image from the alternating phase shifting mask 5 having a phase shift error is accomplished using off-axis illumination 70. By simulating the image using varying off-axis illumination parameters, optimized parameters are determined for compensating for the phase shift error. Once the off-axis illumination parameters are optimized, the image is shot. In addition, the method of varying off-axis illumination parameters to compensate for a phase shift error permits the alternating phase shifting mask to be shot at two different wavelengths. In one embodiment, a photolithography system comprises the alternating phase shifting mask having a phase shift error, an illuminator providing a light source, and a means for controlling the light source to optimize printing of the alternating phase shifting mask. The means for controlling the light source utilizes off-axis illumination. In another embodiment, a method to optimize printing of the alternating phase shifting mask having a phase error comprises the steps of configuring an illuminator for off-axis illumination, performing one or more simulations of an image on the alternating phase shifting mask, and adjusting off-axis illumination parameters based upon the simulations. In yet another embodiment, a method of printing an image from the alternating phase shifting mask using an illuminator operating at a shorter wavelength from what the mask was initially designed for comprises the steps of providing the alternating phase shifting mask, providing an illuminator having a light source, configuring the illuminator for off-axis illumination, performing one or more simulations of the image on the alternating phase shifting mask, and adjusting off-axis illumination parameters based upon the simulations, and then printing an image on the alternating phase shifting mask.

What is claimed is:

1. A photolithography system comprising:
   an alternating phase shifting mask having a phase shift error; and
   an illuminator configured for off-axis illumination wherein the off-axis illumination parameters are optimized to compensate for the effects of the phase error.

2. The photolithography system of claim 1 wherein the illuminator uses empirical data in optimizing the off-axis illumination parameters.

3. The photolithography system of claim 2 wherein the empirical data is taken from one or more simulations of an image on the alternating phase shifting mask.

4. The photolithography system of claim 1, further comprising a ring having an inner radius and an outer radius, the ring located between the alternating phase shifting mask and the illuminator, such that a light source from the illuminator passes inside the outer radius and outside the inner radius of the ring to the alternating phase shifting mask.

5. The photolithography system of claim 4, wherein the off-axis illumination parameters are optimized by adjusting the inner radius and the outer radius of the ring.

6. A photolithography system, comprising:
   an alternating phase shifting mask having a phase shift error;

an illuminator providing a light source; and a means for controlling the light source to optimize printing of the alternating phase shifting mask.

7. The photolithography system of claim 6 wherein the means for controllingthe light source utilizes off-axis illumination.

8. The photolithography system of claim 7 wherein off-axis illumination parameters are optimized from simulations of an image on the alternating phase shifting mask.

9. A method to optimize printing of an alternating phase shifting mask having a phase error, the method comprising:

configuring an illuminator for off-axis illumination;

performing one or more simulations of an image on the alternating phase shifting mask; and adjusting off-axis illumination parameters based upon the one or more simulations.

10. The method of claim 9 wherein performing one or more simulations includes varying a depth of focus of the image on the alternating phase shifting mask.

11. The method of claim 10, wherein varying the depth of focus of the image includes changing an inner radius of a ring and changing an outer radius of the ring, the ring located between the illuminator and the alternating phase shifting mask, such that a light source from the illuminator passes inside the outer radius and outside the inner radius of the ring to the alternating phase shifting mask.

12. The method of claim 9 wherein performing one or more simulations includes varying sigma in and sigma out parameters corresponding to the illuminator.

13. A method to optimize printing of an alternating phase shifting mask having a phase error, the method comprising:

providing the alternating phase shifting mask having a phase shift error;

providing an illuminator having a light source;

performing one or more simulations on an image of the alternating phase shifting mask; and providing a means for controlling the light source to optimize printing of the alternating phase shifting mask based upon the one or more simulations.

14. The method of claim 13 wherein providing an illuminator utilizes off-axis illumination.

15. The method of claim 13 wherein performing one or more simulations includes varying a depth of focus of the image on the alternating phase shifting mask.

16. The method of claim 15, wherein varying the depth of focus of the image includes changing an inner radius of a ring and changing an outer radius of the ring, the ring located between the illuminator and the alternating phase shifting mask, such that the light source from the illuminator passes inside the outer radius and outside the inner radius of the ring to the alternating phase shifting mask.

17. The method of claim 13 wherein performing one or more simulations includes varying sigma in and sigma out parameters corresponding to the illuminator.

18. A method of printing an image from an alternating phase shifting mask at two different wavelengths, the method comprising:

providing the alternating phase shifting mask;

providing a first illuminator having a first light source at a first wavelength;

printing the image on the alternating phase shifting mask;

providing a second illuminator having a second light source at a second wavelength;

configuring the second illuminator for off-axis illumination;

performing one or more simulations of the image on the alternating phase shifting mask;

adjusting off-axis illumination parameters based upon the one or more simulations; and printing the image on the alternating phase shifting mask.

19. The method of claim 18 wherein providing a first illuminator utilizes an I-line light source.

20. The method of claim 18 wherein performing one or more simulations includes varying a depth of focus of the image on the alternating phase shifting mask.

21. The method of claim 20, wherein varying the depth of focus of the image includes changing an inner radius of a ring and changing an outer radius of the ring, the ring located between the first illuminator and the alternating phase shifting mask, such that the first light source from the first illuminator passes inside the outer radius and outside the inner radius of the ring to the alternating phase shifting mask.

22. The method of claim 20, wherein varying the depth of focus of the image includes changing an inner radius of a ring and changing an outer radius of the ring, the ring located between the second illuminator and the alternating phase shifting mask, such that the second light source from the second illuminator passes inside the outer radius and outside the inner radius of the ring to the alternating phase shifting mask.

23. The method of claim 18 wherein performing one or more simulations includes varying sigma in and sigma out parameters corresponding to the illuminator.

24. The method of claim 18 wherein providing a second illuminator utilizes a deep ultra-violet (UV) light source.

25. A method of printing an image from an alternating phase shifting mask using an illuminator operating at a different wavelength from what the mask was initially designed for, the method comprising:

providing the alternating phase shifting mask;

providing the illuminator having a light source;

configuring the illuminator for off-axis illumination;

performing one or more simulations of the image on the alternating phase shifting mask;

adjusting off-axis illumination parameters based upon the one or more simulations; and printing the image on the alternating phase shifting mask.

26. The method of claim 25 wherein performing one or more simulations includes varying a depth of focus of the image on the alternating phase shifting mask.

27. The method of claim 26, wherein varying the depth of focus of the image includes changing an inner radius of a ring and changing an outer radius of the ring, the ring located between the illuminator and the alternating phase shifting mask, such that a light source from the illuminator passes inside the outer radius and outside the inner radius of the ring to the alternating phase shifting mask.

28. The method of claim 25 wherein performing one or more simulations includes varying sigma in and sigma out parameters corresponding to the illuminator.

29. The method of claim 25 wherein providing the illuminator utilizes a deep ultra-violet (UV) light source.

30. A photolithography system comprising:

an attenuating phase shifting mask having a phase shift error; and an illuminator configured for off-axis illumination wherein the off-axis illumination parameters are optimized to compensate for the effects of the phase error.

31. The photolithography system of claim 30 wherein the illuminator uses empirical data in optimizing the off-axis illumination parameters.

32. The photolithography system of claim 31 wherein the empirical data is taken from one or more simulations of an image on the attenuating phase shifting mask.

33. The photolithography system of claim 30, further comprising a ring having an inner radius and an outer radius, the ring located between the attenuating phase shifting mask and the illuminator, such that a light source from the illuminator passes inside the outer radius and outside the inner radius of the ring to the attenuating phase shifting mask.

34. The photolithography system of claim 33, wherein the off-axis illumination parameters are optimized by adjusting the inner radius and the outer radius of the ring.

35. A photolithography system, comprising:
an attenuating phase shifting mask having a phase shift error;
an illuminator providing a light source; and
a means for controlling the light source to optimize printing of the attenuating phase shifting mask.

36. The photolithography system of claim 35 wherein the means for controlling the light source utilizes off-axis illumination.

37. The photolithography system of claim 36 wherein off-axis illumination parameters are optimized from simulations of an image on the attenuating phase shifting mask.

38. A method to optimize printing of an attenuating phase shifting mask having a phase error, the method comprising:
configuring an illuminator for off-axis illumination;
performing one or more simulations of an image on the attenuating phase shifting mask; and
adjusting off-axis illumination parameters based upon the one or more simulations.

39. The method of claim 38 wherein performing one or more simulations includes varying a depth of focus of the image on the attenuating phase shifting mask.

40. The method of claim 39, wherein varying the depth of focus of the image includes changing an inner radius of a ring and changing an outer radius of the ring, the ring located between the illuminator and the attenuating phase shifting mask, such that a light source from the illuminator passes inside the outer radius and outside the inner radius of the ring to the attenuating phase shifting mask.

41. The method of claim 38 wherein performing one or more simulations includes varying sigma in and sigma out parameters corresponding to the illuminator.

42. A method to optimize printing of an attenuating phase shifting mask having a phase error, the method comprising:
providing the attenuating phase shifting mask having a phase shift error;
providing an illuminator having a light source;
performing one or more simulations on an image of the attenuating phase shifting mask; and
providing a means for controlling the light source to optimize printing of the attenuating phase shifting mask based upon the one or more simulations.

43. The method of claim 42 wherein providing an illuminator utilizes off-axis illumination.

44. The method of claim 42 wherein performing one or more simulations includes varying a depth of focus of the image on the attenuating phase shifting mask.

45. The method of claim 44, wherein varying the depth of focus of the image includes changing an inner radius of a ring and changing an outer radius of the ring, the ring located between the illuminator and the attenuating phase shifting mask, such that the light source from the illuminator passes inside the outer radius and outside the inner radius of the ring to the attenuating phase shifting mask.

46. The method of claim 42 wherein performing one or more simulations includes varying sigma in and sigma out parameters corresponding to the illuminator.

47. A method of printing an image from an attenuating phase shifting mask at two different wavelengths, the method comprising:
providing the attenuating phase shifting mask;
providing a first illuminator having a first light source at a first wavelength;
printing the image on the attenuating phase shifting mask;
providing a second illuminator having a second light source at a second wavelength;
configuring the second illuminator for off-axis illumination;
performing one or more simulations of the image on the attenuating phase shifting mask;
adjusting off-axis illumination parameters based upon the one or more simulations; and
printing the image on the attenuating phase shifting mask.

48. The method of claim 47 wherein providing a first illuminator utilizes an I-line light source.

49. The method of claim 47 wherein performing one or more simulations includes varying a depth of focus of the image on the attenuating phase shifting mask.

50. The method of claim 49, wherein varying the depth of focus of the image includes changing an inner radius of a ring and changing an outer radius of the ring, the ring located between the first illuminator and the attenuating phase shifting mask, such that the first light source from the first illuminator passes inside the outer radius and outside the inner radius of the ring to the attenuating phase shifting mask.

51. The method of claim 49, wherein varying the depth of focus of the image includes changing an inner radius of a ring and changing an outer radius of the ring, the ring located between the second illuminator and the attenuating phase shifting mask, such that the second light source from the second illuminator passes inside the outer radius and outside the inner radius of the ring to the attenuating phase shifting mask.

52. The method of claim 47 wherein performing one or more simulations includes varying sigma in and sigma out parameters corresponding to the illuminator.

53. The method of claim 47 wherein providing a second illuminator utilizes a deep ultra-violet (UV) light source.

54. A method of printing an image from an attenuating phase shifting mask using an illuminator operating at a different wavelength from what the mask was initially designed for, the method comprising:
providing the attenuating phase shifting mask;
providing the illuminator having a light source;
configuring the illuminator for off-axis illumination;
performing one or more simulations of the image on the attenuating phase shifting mask;
adjusting off-axis illumination parameters based upon the one or more simulations; and
printing the image on the attenuating phase shifting mask.

55. The method of claim 54 wherein performing one or more simulations includes varying a depth of focus of the image on the attenuating phase shifting mask.

56. The method of claim 55, wherein varying the depth of focus of the image includes changing an inner radius of a ring and changing an outer radius of the ring, the ring located between the illuminator and the attenuating phase shifting mask, such that a light source from the illuminator passes inside the outer radius and outside the inner radius of the ring to the attenuating phase shifting mask.

57. The method of claim 54 wherein performing one or more simulations includes varying sigma in and sigma out parameters corresponding to the illuminator.

58. The method of claim 54 wherein providing the illuminator utilizes a deep ultra-violet (UV) light source.

* * * * *

UNITED STATES PATENT AND TRADEMARK OFFICE
CERTIFICATE OF CORRECTION

PATENT NO.: 6,096,457

DATED: Aug. 1, 2000

INVENTOR(S): Pierrat et al.

It is certified that error appears in the above-identified patent and that said Letters Patent is hereby corrected as shown below:

On the front page, in the inventor, {75}, delete "Christophe Pierrat, Boise, Id." and insert --Christophe Pierrat; Nanseng Jeng, both of Boise, Id.--, therefore.

On the front page, in the header, delete "Pierrat" and insert --Pierrat et al.--, therefore.

Signed and Sealed this

Seventeenth Day of April, 2001

*Attest:*

NICHOLAS P. GODICI

*Attesting Officer*   Acting Director of the United States Patent and Trademark Office